United States Patent [19]
Judd et al.

[11] 4,337,520
[45] Jun. 29, 1982

[54] BUBBLE MEMORY DRIVER

[75] Inventors: Frank F. Judd, Madison; George R. Westerman, Denville, both of N.J.

[73] Assignee: Bell Telephone Laboratories, Incorporated, Murray Hill, N.J.

[21] Appl. No.: 177,119

[22] Filed: Aug. 11, 1980

[51] Int. Cl.³ .................................................. G11C 19/08
[52] U.S. Cl. ......................................................... 365/6
[58] Field of Search ............................................ 365/6

[56] References Cited
U.S. PATENT DOCUMENTS
4,106,088  8/1978  Bergan ..................................... 365/6

Primary Examiner—James W. Moffitt
Attorney, Agent, or Firm—Herbert M. Shapiro

[57] ABSTRACT

In magnetic bubble memories both linear and switched drive circuits are presently in use. The linear circuit can employ a capacitor to achieve resonance and may operate at a relatively high efficiency. However, when a linear coil drive circuit, which had been designed to operate at resonance, is operated just off resonance a substantial loss of power efficiency is observed. A switched coil drive circuit is described herein which achieves high operating power efficiency by using a capacitor in parallel with the bubble coil.

3 Claims, 7 Drawing Figures

BUBBLE MEMORY DRIVER

This invention relates to magnetic bubble memories, and more particularly to circuits for moving bubbles in such memories.

BACKGROUND OF THE INVENTION

The largest single contributor to power losses in a magnetic bubble memory subsystem is often the circuitry required to produce the rotating magnetic drive field. These losses can be as high as 50 to 60 percent of the entire memory board power. Efforts to reduce coil drive losses, while at the same time providing transient free start/stop operation and minimizing bubble output signal noise, have led previous investigators to consider a variety of coil drive techniques. The resulting circuits can be broadly classified as either linear drive or switched drive.

The essential difference between a linear and switched coil drive circuit is that in the former circuit energy is being delivered to the coils by devices operating in their active region whereas in the latter circuit energy is delivered at only discrete time intervals by devices operating in an ON/OFF mode. In linear drive circuits the coil currents are sinusoidal and may be obtained directly from an appropriate amplifier or generated in a tuned circuit operated at resonance. In a switched drive circuit the resulting coil current may be sinusoidal, but more often it is a triangular type waveshape produced by switching alternate polarity direct voltages across the coil.

A linear drive circuit can be designed to operate at relatively high efficiency when driven at resonance. However, a problem with this type of circuit arrangement is that the operating power efficiency will drop drastically if the coil-capacitor combination is allowed to operate off resonance by as little as 4 or 5 percent. Operating a linear drive circuit as much as 5 percent off resonance in a manufacturable memory system is not uncommon considering the manufacturing tolerance on the bubble device coil inductance, the resonating capacitor, and other circuit parameters which effect timing.

In either the linear or the switched coil drive it is advantageous for the coil drive circuitry to be as efficient as possible so as to reduce memory system power requirements and minimize power dissipation in the bubble memory subsystem. Not only will this result in reduced subsystem thermal problems, but will also allow greater memory component packing density on subsystem circuit boards. In addition, system power losses can have a direct effect on memory system data rate by influencing the choice of rotating field frequency.

U.S. Pat. No. 3,952,292 describes a magnetic bubble memory drive circuit wherein a rotating magnetic field is induced by two out-of-phase sine wave currents which are supplied to two substantially perpendicularly positioned solenoid coils encompassing the layer in which magnetic bubbles move. Both linear and switched coil drive circuits are suggested for producing the sine wave coil currents. The patent also describes the conventional use of a capacitor connected in parallel with each of the coils in the coil drive circuit so that the resonance of the coil and capacitor may produce a sine wave coil current in response to a square wave drive voltage.

The patent stresses the fact that the speed of rotation of the magnetic field in response to forced square wave coil currents is not uniform in the coil drive circuit and that this nonuniformity causes problems in the normal operation of a magnetic bubble memory. The nonuniformity of the speed of rotation leads to a reduction in operating margins of the memory. The speed nonuniformity of the rotating field is said to be eliminated by the use of triangular or trapezoidal coil currents, rather than the square wave drive currents, along with the elimination of the use of capacitors in parallel with the coils.

The patent also indicates that the power losses in either a linear or a switched bubble memory coil drive circuit can be an important problem. The reduction of power losses in a drive circuit of a magnetic bubble memory is highly desirable. The prior art, recognizes that if the coil drive circuit is capable of start, stop and reverse field operation then the memory system access time can be reduced. This, in turn, may reduce the amount of time the coil drive circuit is in operation each time the memory is accessed. The corresponding reduction in memory duty cycle leads to a reduction in total system power losses.

It is important to recognize, however, that power losses in a switched coil drive circuitry, during the time it is driving the bubble device coils, are made up of two basic components. These are, first, conduction losses in the switching transistor and other devices in the switching circuit in the time interval during which they conduct current, and, second, switching losses principally in the switching transistors devices which occur during the interval of time they are switching from on to off or from off to on. Despite the fact that these switching times tend to be short compared to conduction intervals, the switching losses in a switched coil drive circuit can be a substantial proportion of the total drive losses. Power losses in a linear coil drive circuit are composed entirely of conduction losses. The problem to which the present invention is directed is the reduction of both switching and conduction losses in a switched coil drive circuit.

BRIEF DESCRIPTION OF THE INVENTION

Switching losses in a switched bubble memory coil drive circuit are reduced by delaying the rise of voltage across the switching transistor relative to the decay of current which flows at the time of turn off. In one embodiment, the delay of collector-emitter voltage rise across the switching transistors is achieved by connecting electrically in parallel with each drive coil a capacitor of a value smaller than that which would cause resonance with the associated coil at the drive frequency. This delay in transistor turn-off voltage also results in a reduction in the conduction intervals of the switching transistors and corresponding fly-back diodes. Thus, both conduction and switching losses can be reduced.

In addition to a reduction in circuit losses, the use of a suitable capacitor in parallel with the bubble coil dramatically reduces the high frequency components in both the coil voltage and current. This has the added benefit of reducing a potential source of noise during bubble detection.

DETAILED DESCRIPTION

Figure 1:
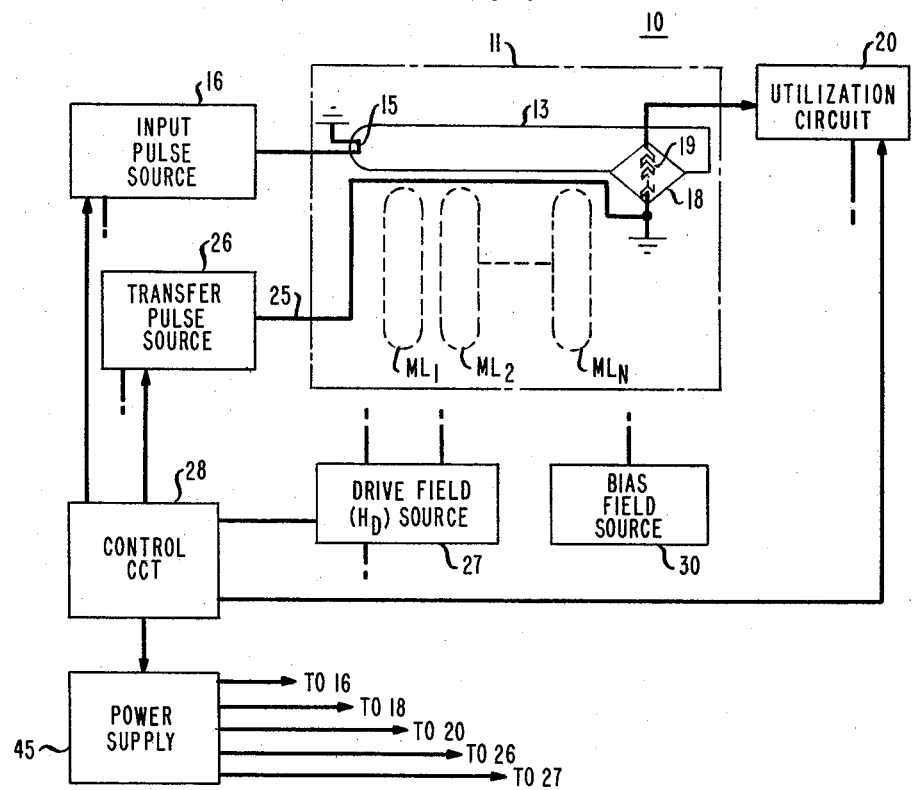
FIG. 1 is a block diagram of a magnetic bubble memory.

FIG. 1 shows a magnetic bubble memory 10 including a layer of material 11 in which magnetic bubbles can be moved. Bubbles are moved in closed loop paths termed "minor loops" and designated $ML_1$, $ML_2$ ... $ML_n$ in the figure. Access to and from the minor loops is via an accessing path or loop termed a "major" loop herein and designated 13.

A bubble generator 15 is coupled to loop 13 and is connected between a source of input pulses 16 and ground. An expansion detector arrangement 18 also couples loop 13. Arrangement 18 includes a magnetoresistive element 19 connected between utilization circuit 20 and ground.

Bubble movement between loops $ML_1$ to $ML_N$ and loop 13 occurs in response to a pulse in conductor 25 applied by transfer pulse source 26. In this manner, a pattern of bubbles generated at 15 is moved to a selected storage address in the minor loops during a write operation, or data stored at such an address is moved to loop 13 during a read operation. All bubble movement in layer 11 occurs in response to a reorienting in-plane magnetic field supplied by drive field source 27 to X and Y oriented coils each encompassing layer 11.

All operations herein are synchronized to the period of the in-plane field under the control of a control circuit represented by block 28. Bubbles in layer 11 are maintained at a selected operating diameter by a bias field usually supplied by a permanent magnet represented by bias field source 30.

Figure 2:
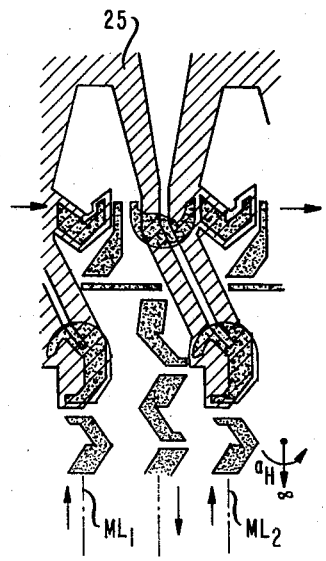
FIG. 2 is an enlarged top view of a portion of the memory of FIG. 1.

Frequently, data stored in a selected address of the minor loops are swapped for data written at 15 in FIG. 1. In this instance, transfer conductor 25 operates as a swap gate and the memory is organized as shown in U.S. Pat. No. 4,007,453 of P. I. Bonyhard issued Feb. 8, 1977. FIG. 2 shows the top view of the "write" end of the major "path" of such an arrangement. A duplicate of the major path is defined at the opposite end of the minor loops and includes a detector in such "swap" organization as is well known.

Figure 3:
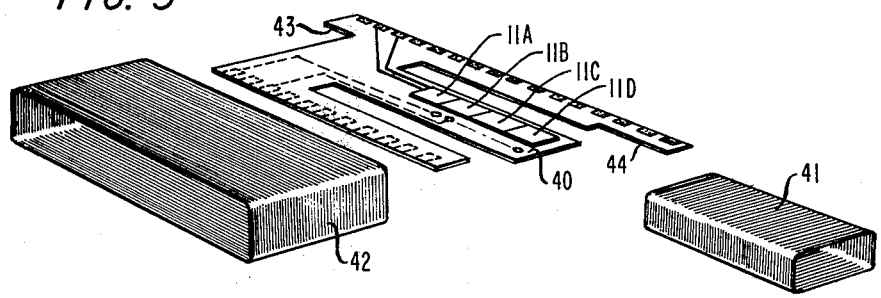
FIG. 3 is an exploded view of the drive coil arrangement for moving bubbles in the memory of FIG. 1.

Whatever the organization of the memory, bubble movement occurs in response to the reorienting (rotating) in-plane field and it is to source 27, its organization and its operation to which we now direct our attention. Source 27 drives two coils which generate the rotating in-plane field in layer 11 as is well known. The common physical layout of the coils with respect to a four chip memory is shown in FIG. 3. Specifically, the figure shows four memory chips each with a bubble layer, designated $11_A$, $11_B$, $11_C$, and $11_D$, in the figure. The chips are mounted on a board 40 which is slotted to receive an "inner" coil 41. An "outer" coil 42 is positioned against bearing surfaces 43 and 44 encompassing the chips and the inner coil.

Source 27 is operative to apply power from power supply 45 of FIG. 1 to coils 41 and 42 to produce the required in-plane field.

Figure 4:
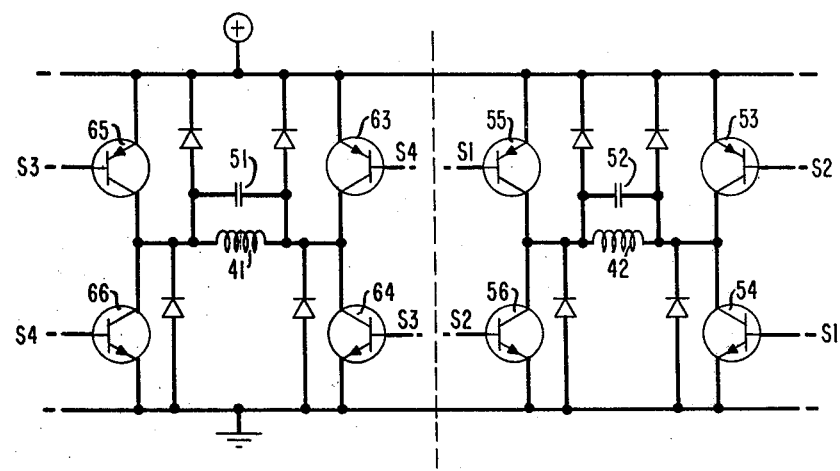
FIGS. 4 and 5 are switched and linear drive circuit arrangements respectively for the coils of FIG. 3.
Figure 5:
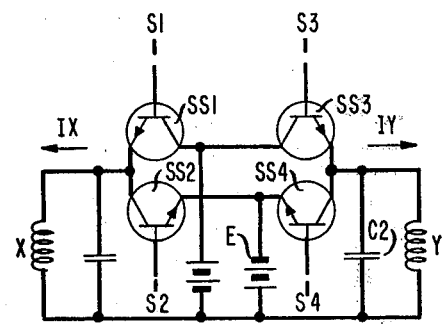

In a switched coil drive circuit, source 27 may be either a full-bridge circuit as shown in FIG. 4, or a half-bridge circuit suggested in FIG. 5 (less the two fly-back diodes). The half-bridge circuit has the advantage of requiring about half the components of the full-bridge circuit. However, this advantage is gained at the expense of requiring two equal valued, but opposite polarity power supplies. Furthermore, if these two required power supplies are not matched in value as a function of circuit operating conditions, a substantial amount of direct current may flow in one or both of the coils. The existence of such a d-c component of coil current can have a detrimental effect on bubbles propagation. For this reason the full-bridge embodiment of the invention is described here and is shown in FIG. 4.

FIG. 4 represents coils 41 and 42 as inductances and shows capacitors 51 and 52 connected electrically in parallel with the inductances, respectively. The inductance-capacitance arrangement 42–52 is connected between the collectors of transistor pairs 53–54 and 55–56 as shown. The emitters of transistors 53 and 55 are connected to power supply 45 of FIG. 1 and the emitters of transistors 54 and 56 are connected to ground. The bases of all transistors 53, 54, 55, and 56 are connected to control circuit 28 of FIG. 1 which applies timing drive pulses thereto.

In a similar manner, inductance-capacitance circuit 41–51 is connected between the collectors of transistors 63–64 and 65–66 as shown. The emitters of transistors 63 and 65 are connected to power supply 45 and the emitters of transistors 64 and 66 are connected to ground. Again, the bases of transistors 63, 64, 65, and 66 are connected to control circuit 28.

Figure 6:
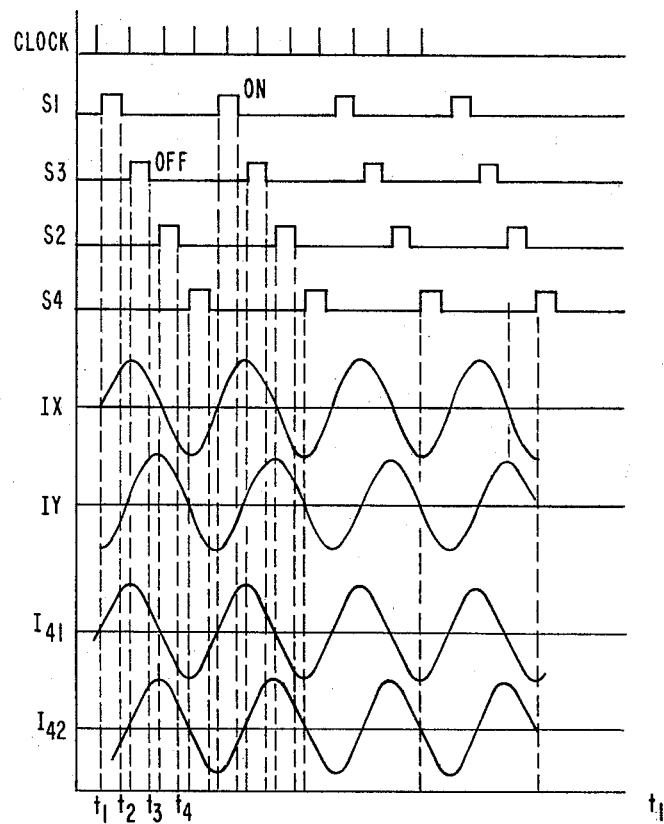
FIG. 6 is a pulse diagram of the operation of the circuit of FIG. 4.

Operation is similar to that of the analagous prior art circuit of FIG. 5 as shown in the pulse diagram of FIG. 6. In FIG. 5, the memory coils are designated X and Y, the transistors are designated SS1, SS2, SS3, and SS4. The timing pulses applied to the base electrodes of transistors SS1, SS2, SS3, and SS4 are designated S1, S2, S3, and S4, respectively. Capacitors C1 and C2 are shown connected in parallel with the coils X and Y, respectively.

The circuit of FIG. 5 is synchronized to a train of clock pulses shown at the top in FIG. 6 and supplied by a clock assumed included in control circuit 28 of FIG. 1. The clock pulses are used to generate the base timing pulse sequences S1, S2, S3, and S4 at times $t_1$, $t_2$, $t_3$, and $t_4$ as shown in the figure. The values of capacitors C1 and C2 in the prior art circuit of FIG. 5 are chosen to resonate with coils X and Y of FIG. 5 at the base timing frequency. The resonance of the capacitor and inductor produces the sinusoidal currents IX and IY as shown in FIGS. 5 and 6.

When the coils X and Y, and their corresponding capacitors, are operated at resonance the control circuit 28 can be designed so that the circuit in FIG. 5 may operate at a relatively high efficiency. However, a problem with this type of circuit arrangement is that the relative phase between the peak of the outer coil current and the bubble function signals is extremely sensitive to parameter variations. If the circuit is operated a few percent off resonance the resulting change in relative phase may significantly reduce the bubble device operating margins. Operating the circuit of FIG. 5 as much as 5 percent off resonance in a manufacturable memory system is not uncommon considering the manufacturing tolerances on the bubble device coil inductance, the resonating capacitor, and other circuit parameters which effect timing.

In the circuit of FIG. 4 he capacitors 51 and 52 are chosen to have values different from those of the prior art circuit of FIG. 5. Whereas the latter are chosen to produce resonance with the drive coils (X and Y) at the drive frequency, the former are chosen to have values which would produce resonance at a frequency which is somewhat higher than the drive frequency.

The presence of the capacitors 51 and 52 in FIG. 4 result in several interesting affects on circuit performance. First, the capacitors cause the transistor switching losses to be reduced by delaying the collector-emitter voltage from rising during that portion of the turn-off time when full collector current is flowing. As the value of the capacitor is increased toward its resonance value, not only are transistor switching losses reduced, but diode conduction losses are also reduced.

Second, the resulting delay in collector-emitter voltage rise produces a phase delay between the falling edge of, say, S1 and the peak of the coil 42 current. The resulting delay must be accounted for and matched in both the inner and outer coil driver. For this reason, capacitors 51 and 52 may not be selected independently. However, an additional benefit gained from this resulting delay is that the point in the rotating field cycle where transistor switching noise would normally occur can be placed at such a spot that it does not have as much influence on the bubble detection process.

Finally, the energy stored in the capacitor is released at the peak of the coil current causing a rounding of the coil current peak. Moreover, since the energy released is proportional to the capacitor value, the larger the capacitor value the higher the current peak assuming equal transistor on time. Conversely, as the capacitor value is increased the transistor conduction time can be decreased, with an accompanying decrease in transistor conduction losses, assuming a constant drive frequency and peak coil current.

Figure 7:
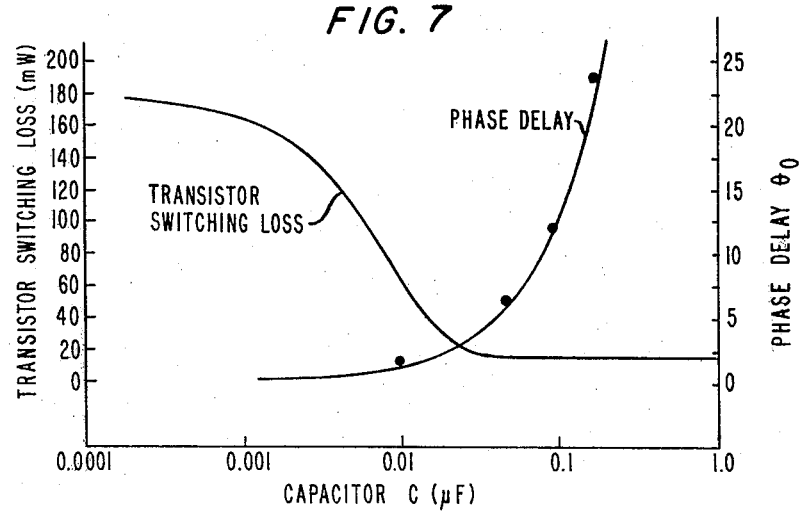
FIG. 7 is a graph of switching loss versus capacitance for the circuit of FIG. 4.

As an illustration of these effects FIG. 7 shows a graph of transistor switching losses for the circuit of FIG. 4 versus the value of outer coil rounding capacitor 51. These data are computed for a bubble memory system in which two inner and two outer coils were driven in parallel at 100 kHz. In the bubble devices being used, a single inner coil had, typically 34.4 $\mu$H of inductance, whereas a single outer coil was 14.9 $\mu$H. Note also in FIG. 7 that the resulting outer coil phase delay for this memory system is also shown. The solid curve is computed data and the encircled dots are measured data. It is clear from FIG. 7 that in this coil drive circuit an outer coil capacitor of 0.05 $\mu$F or larger will minimize transistor switching losses. This value of capacitance is substantially less than that required to resonate two parallel outer coils at 100 kHz. Once an outer coil capacitor is chosen, a corresponding inner coil capacitor is selected so as to equalize the resulting phase delay.

As a comparison of the measured efficiency of various known coil circuits, the data of the following table was obtained at an operating frequency of 100 kHz using the same coil arrangement described in the previous paragraph.

| COMPARISON OF COIL DRIVE CIRCUITS | | | |
|---|---|---|---|
| Outer Coil | Measured | Equivalent Coil Inductance | |
| Drive Circuit | Efficiency | Outer | Inner |
| Linear Drive Ckt | | | |
| Class - B | 48% | 7.45$\mu$H | 17.2$\mu$ |
| Class - C (d = 0.6) | 60% | 7.45$\mu$H | 17.2$\mu$H |
| Switched Drive Ckt (Outer Coil) | | | |
| C = 0 | 23% | 7.45$\mu$H | 17.2$\mu$H |
| C = 0.05$\mu$F | 30% | 7.45$\mu$H | 17.2$\mu$H |
| C = 0.3$\mu$F | 60% | 7.45$\mu$H | 17.2$\mu$H |

Note that the switched drive circuit with a large rounding capacitor (C=0.3 $\mu$F) is just as efficient as the Class C circuit with 60% duty cycle. The substantial increase in efficiency in the switched drive circuit when using the 0.3 $\mu$F capacitor in place of the 0.05 $\mu$F capacitor is due to a decrease in both diode and transistor conduction losses.

In operation, the circuit of FIG. 4 includes emitter-collector diodes as shown. These diodes are required to conduct out-of-phase currents during the time interval between when the switching transistors had been turned off and the resulting coil current reverses.

An alternate embodiment of the circuit in FIG. 4 uses two capacitors per bubble coil instead of the single capacitor shown in the figures. Such capacitors are connected from either side of the bubble coil to ground rather than directly across the coil. The obvious disadvantages of this embodiment are that twice as many capacitors are needed and that each must be twice the value of the single capacitor. However, the advantage gained is that the two capacitor embodiment results in lower a-c impedance from each side of the bubble coil to ground. This can result in less common mode noise across the bubble coils which in turn can reduce bubble detection noise.

We claim:

1. A magnetic bubble memory driver for moving magnetic bubbles in a layer of magnetic material in which said bubbles can be moved, said driver comprising first and second coils arranged transverse to one another and adapted for producing a reorienting magnetic field in the plane of said layer, said driver also comprising first and second switched coil drive circuit means including first and second switching transistors for applying square wave voltages to said first and second coils respectively at a base drive frequency and first and second capacitors connected with said coils in such a manner as to delay the rise of voltage across said switching transistors respectively with respect to the decay of current in said transistors at turn-off, said first and second capacitors having first and second values smaller than that at which the associated one of said coils would resonate at said base drive frequency chosen for minimizing semiconductor conduction and switching losses in said drive circuit means.

2. A magnetic bubble memory driver in accordance with claim 1 wherein said first and second capacitors are connected electrically in parallel with said coils.

3. A magnetic bubble memory drive in accordance with claim 1 wherein said second capacitor has a value to equalize the phase delay of said first capacitor.

* * * * *